US009865490B2

(12) United States Patent
Bai et al.

(10) Patent No.: US 9,865,490 B2
(45) Date of Patent: Jan. 9, 2018

(54) CYCLIC OLEFIN POLYMER COMPOSITIONS AND POLYSILOXANE RELEASE LAYERS FOR USE IN TEMPORARY WAFER BONDING PROCESSES

(71) Applicant: Brewer Science Inc., Rolla, MO (US)

(72) Inventors: Dongshun Bai, Rolla, MO (US); Gu Xu, Rolla, MO (US); Debbie Blumenshine, Rolla, MO (US); Baron Huang, Taipei (TW); Andrew Wong, Taipei (TW)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 15/332,581

(22) Filed: Oct. 24, 2016

(65) Prior Publication Data
US 2017/0040200 A1      Feb. 9, 2017

Related U.S. Application Data

(63) Continuation-in-part of application No. 14/590,531, filed on Jan. 6, 2015, now Pat. No. 9,496,164.
(Continued)

(51) Int. Cl.
*H01L 21/00* (2006.01)
*H01L 21/683* (2006.01)
(Continued)

(52) U.S. Cl.
CPC .......... *H01L 21/6835* (2013.01); *B32B 7/06* (2013.01); *B32B 7/12* (2013.01); *B32B 27/08* (2013.01);
(Continued)

(58) Field of Classification Search
CPC ....... H01L 21/6835; H01L 2221/68327; H01L 21/635
(Continued)

(56) References Cited

U.S. PATENT DOCUMENTS

| 4,069,076 A | 1/1978 | Fickes |
| 4,332,923 A | 6/1982 | Rainear |

(Continued)

FOREIGN PATENT DOCUMENTS

| EP | 2 868 726 | 5/2015 |
| JP | 2014-130853 | 7/2014 |
| WO | 2012/118700 A1 | 9/2012 |

OTHER PUBLICATIONS

International Search Report and Written Opinion dated Apr. 27, 2015 in corresponding PCT/US2015/010290 filed Jan. 6, 2015.
(Continued)

*Primary Examiner* — Shelia V Clark
(74) *Attorney, Agent, or Firm* — Hovey Williams LLP

(57) ABSTRACT

The invention broadly relates to cyclic olefin polymer bonding compositions and release compositions, to be used independently or together, that enable thin wafer handling during microelectronics manufacturing, especially during a full-wafer mechanical debonding process. The release compositions comprise compositions made from siloxane polymers and copolymers blended in a polar solvent, and that are stable at room temperature for longer than one month. The cyclic olefin polymer bonding compositions provide high thermal stability, can be bonded to fully-treated carrier wafers, can be mechanically or laser debonded after high-temperature heat treatment, and are easily removed with an industrially-acceptable solvent. Wafers bonded according to the invention demonstrate lower overall post-grind stack
(Continued)

TTV compared to other commercial bonding materials and can survive 200° C. PECVD processing.

32 Claims, 7 Drawing Sheets

Related U.S. Application Data

(60) Provisional application No. 61/924,442, filed on Jan. 7, 2014, provisional application No. 61/952,945, filed on Mar. 14, 2014.

(51) Int. Cl.

| | | |
|---|---|---|
| *H01L 21/50* | (2006.01) | |
| *C08G 77/14* | (2006.01) | |
| *C08G 77/20* | (2006.01) | |
| *C08G 77/18* | (2006.01) | |
| *C08G 77/26* | (2006.01) | |
| *C09J 145/00* | (2006.01) | |
| *C09J 183/06* | (2006.01) | |
| *B32B 7/06* | (2006.01) | |
| *B32B 7/12* | (2006.01) | |
| *B32B 27/08* | (2006.01) | |
| *B32B 27/28* | (2006.01) | |
| *B32B 27/32* | (2006.01) | |
| *C09J 5/06* | (2006.01) | |

(52) U.S. Cl.
CPC .......... *B32B 27/283* (2013.01); *B32B 27/325* (2013.01); *C08G 77/14* (2013.01); *C08G 77/18* (2013.01); *C08G 77/20* (2013.01); *C08G 77/26* (2013.01); *C09J 5/06* (2013.01); *C09J 145/00* (2013.01); *C09J 183/06* (2013.01); *H01L 21/50* (2013.01); *B32B 2255/10* (2013.01); *B32B 2255/205* (2013.01); *B32B 2457/14* (2013.01); *C09J 2203/326* (2013.01); *C09J 2205/302* (2013.01); *C09J 2423/00* (2013.01); *H01L 2221/6834* (2013.01); *H01L 2221/68318* (2013.01); *H01L 2221/68327* (2013.01); *H01L 2221/68381* (2013.01)

(58) Field of Classification Search
USPC .................................. 438/118, 125
See application file for complete search history.

(56) References Cited

U.S. PATENT DOCUMENTS

| | | |
|---|---|---|
| 4,976,817 A | 12/1990 | Correa et al. |
| 5,372,670 A | 12/1994 | Cummings et al. |
| 6,345,881 B1 | 2/2002 | Yang et al. |
| 6,544,466 B1 | 4/2003 | Westmoreland |
| 7,678,861 B2 | 3/2010 | Moore et al. |
| 7,935,780 B2 | 5/2011 | Hong et al. |
| 8,092,628 B2 | 1/2012 | Hong et al. |
| 8,221,571 B2 | 7/2012 | Hong et al. |
| 8,236,669 B2 | 8/2012 | Hong et al. |
| 8,268,449 B2 | 9/2012 | Moore et al. |
| 8,440,174 B2 | 5/2013 | Panandiker et al. |
| 2007/0284601 A1* | 12/2007 | Khanarian .............. H01L 33/22 257/98 |
| 2008/0173970 A1 | 7/2008 | Pillalamarri |
| 2008/0200011 A1 | 8/2008 | Pillalamarri et al. |
| 2009/0218560 A1 | 9/2009 | Flaim et al. |
| 2010/0206479 A1 | 8/2010 | Pillalamarri et al. |
| 2011/0069467 A1 | 3/2011 | Flaim et al. |
| 2011/0308739 A1* | 12/2011 | McCutcheon ........ H01L 21/187 156/766 |
| 2012/0034437 A1* | 2/2012 | Puligadda ........... H01L 21/2007 428/212 |
| 2013/0018145 A1 | 1/2013 | Seth et al. |
| 2013/0201635 A1 | 8/2013 | Xu |
| 2014/0117504 A1* | 5/2014 | Oliver ........................ C09J 5/00 257/618 |
| 2014/0318697 A1* | 10/2014 | Tan ....................... H01L 21/673 156/247 |
| 2015/0035126 A1* | 2/2015 | Gandhi ............. H01L 21/76254 257/632 |
| 2015/0097301 A1* | 4/2015 | Gandhi ............. H01L 21/76254 257/783 |
| 2015/0184032 A1* | 7/2015 | Iwai .................. H01L 21/31133 438/694 |
| 2015/0184035 A1* | 7/2015 | Koyama ............. H01L 21/6835 428/352 |
| 2015/0284603 A1 | 10/2015 | Iwai et al. |
| 2016/0252665 A1* | 9/2016 | Lee ........................ G02B 5/305 359/489.07 |
| 2016/0336538 A1* | 11/2016 | Yamazaki ........... H01L 27/1214 |
| 2017/0214021 A1* | 7/2017 | Yen ..................... H01M 2/1653 |

OTHER PUBLICATIONS

Office Action dated Sep. 23, 2015 in corresponding U.S. Appl. No. 14/590,531, filed Jan. 6, 2015, 5 pages.
Office Action dated Feb. 25, 2016 in corresponding U.S. Appl. No. 14/590,531, filed Jan. 6, 2015, 13 pages.

* cited by examiner

CYCLIC OLEFIN POLYMER COMPOSITIONS AND POLYSILOXANE RELEASE LAYERS FOR USE IN TEMPORARY WAFER BONDING PROCESSES

RELATED APPLICATIONS

This application claims the priority benefit of provisional applications entitled CYCLIC OLEFIN POLYMER COMPOSITIONS FOR USE IN TEMPORARY WAFER BONDING PROCESSES, Application No. 61/924,442, filed Jan. 7, 2014, and ULTRATHIN POLYSILOXANE COATINGS AS LOW-FORCE MECHANICAL RELEASE LAYERS FOR ADHESIVELY BONDED MICROELECTRONICS SUBSTRATES, Application No. 61/952,945, filed Mar. 14, 2014, each of which is incorporated by reference herein. This application is also a continuation-in-part of CYCLIC OLEFIN POLYMER COMPOSITIONS AND POLYSILOXANE RELEASE LAYERS FOR USE IN TEMPORARY WAFER BONDING PROCESSES, application Ser. No. 14/590,531, filed Jan. 6, 2015, which is incorporated by reference herein.

BACKGROUND OF THE INVENTION

Field of the Invention

This invention relates to release layers and bonding materials for temporary wafer bonding processes. More particularly, the invention generally relates to the use of a lamination process to apply pre-formed dry films for temporary wafer bonding purposes.

Description of the Prior Art

Wafer bonding materials protect device features on the front side of a device substrate, and provide adhesion to a carrier substrate and mechanical support for the thinned wafers during backside processing. 3D-IC processing, especially with through-silicon via ("TSV") and through-glass via ("TGV") technology, requires temporary wafer bonding materials to survive processes at high temperatures and high vacuum, such as plasma-enhanced chemical vapor deposition ("PECVD"). This technology also requires that the materials can be removed easily from the wafers after processing. Additionally, lower cost of ownership is needed for the 3D-IC to be adopted by the manufacturers.

Integrated circuit and semiconductor packaging manufacturers are continually looking for temporary wafer bonding technology with low cost of ownership, that uses materials capable of surviving processing at high temperatures and under high vacuum, and that can be easily cleaned after processing. So far, no single technology/material can satisfy all these requirements. Cyclic olefin copolymer (COC) bonding materials are one class of materials that are commonly used. These COCs, such as those formulated using TOPAS® and APEL® materials, are produced by chain copolymerization of cyclic monomers with ethene. These COC materials are good for some applications, but it is very difficult to obtain a clear solution in commonly-used solvents such as d-limonene and mesitylene, and it can also be difficult to clean them off the substrates after processing.

In some temporary bonding schemes, such as Zone-BOND® zonal bonding from Brewer Science, Inc. (described in US Patent Publication No. 2009/0218560 and application Ser. No. 12/819,680, both of which are hereby incorporated by reference), carrier wafers may require pretreatment with a coating before the wafers are bonded together. Previously, a halogenated silane in a fluorinated solvent, such as 3M FC-40 Fluorinert™ electronic liquid, was used for carrier wafer preparation. However, the silane/FC-40 solution is not a practical coating material because it is unstable, and FC-40 is restricted for use in microelectronics manufacturing because of environmental concerns. Vapor deposition of fluorinated silanes has been used previously to treat the surfaces of silicon wafers. However, vapor deposition is a process that is costly because of both the time involved and the expensive, high-quality tooling it requires.

There is a need for additional bonding methods and materials that overcome the shortcomings described above.

SUMMARY OF THE INVENTION

In one or more embodiments, a temporary bonding method is provided. The method involves providing a stack comprising:
a first substrate having a back surface and a front surface;
a bonding layer adjacent the front surface, with the bonding layer being formed from a composition comprising a cyclic olefin polymer dissolved or dispersed in a solvent system; and
a second substrate having a first surface. The first and second substrates are separated without subjecting the stack to heat.

In one or more embodiments, the invention provides a temporary bonding method comprising:
providing a stack comprising:
a first substrate having a back surface and a front surface;
a bonding layer adjacent the front surface; and
a second substrate having a first surface, with the first surface including a polysiloxane nonstick layer adjacent the bonding layer.
The first and second substrates are then separated.

In one or more embodiments, the invention provides an article comprising a first substrate having a back surface and a front surface. There is a bonding layer adjacent the front surface. The article also comprises a second substrate having a first surface, with the first surface including a polysiloxane nonstick layer adjacent the bonding layer.

In one or more embodiments, the invention provides a temporary bonding method comprising:
(i) providing a free-standing film comprising a cyclic olefin polymer;
(ii) forming a stack at a temperature of at least 100° C., wherein the stack comprises a first substrate having a back surface and a front surface; a bonding layer adjacent the front surface, the bonding layer being formed from the free-standing film; and a second substrate having a first surface; and
(iii) separating the first and second substrates.

In one or more embodiments, the invention provides a temporary bonding method comprising:
(i) providing a bonding film comprising a cyclic olefin polymer;
(ii) forming a stack at a temperature of at least 100° C., wherein the stack comprises a first substrate having a back surface and a front surface; a bonding layer adjacent the front surface, the bonding layer being formed from the bonding film; and a second substrate having a first surface; and
(iii) separating the first and second substrates.

In one or more embodiments, the invention provides a temporary bonding method comprising:
(i) providing a bonding film;
(ii) applying a wetting liquid onto (a) a first substrate having a back surface and a front surface and/or (b) a second substrate having a first surface;
(iii) forming a stack at a temperature of at least 100° C., wherein the stack comprises the first substrate; a bonding layer adjacent the front surface, the bonding layer being formed from the bonding film; and the second substrate; and (iv) separating the first and second substrates.

DETAILED DESCRIPTION OF THE PREFERRED EMBODIMENTS

Release Layers

Figure 1:
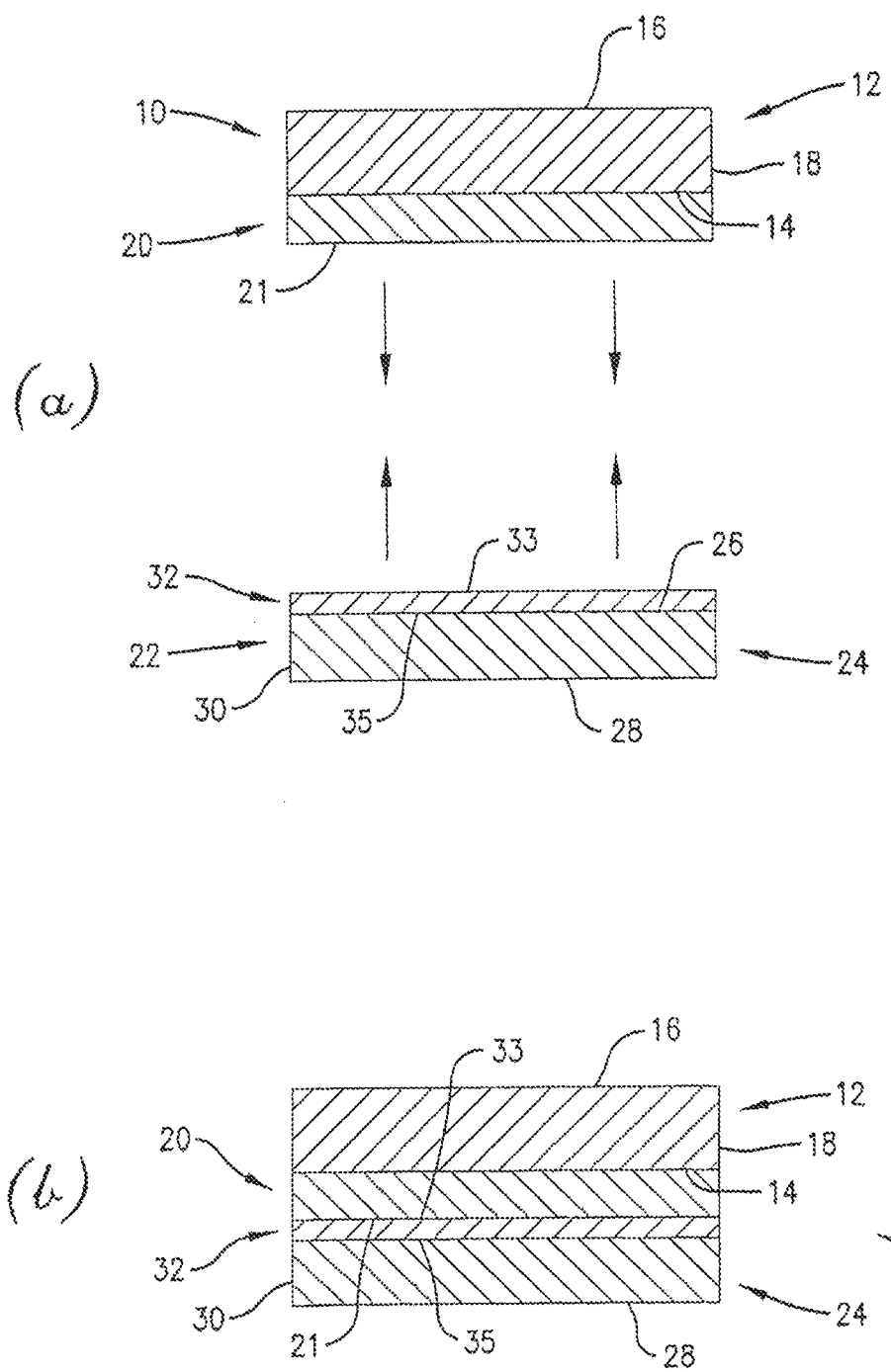
FIG. 1 is a cross-sectional view of a schematic drawing showing a preferred embodiment of the invention.

In one embodiment, a release layer is utilized. Several types of release layers can be utilized with the present invention, as explained in more detail below, but one preferred type is a nonstick layer. Preferred compositions for use in forming a nonstick release layer according to the invention comprise siloxane polymers and copolymers (both copolymers with siloxanes as well as copolymers with non-siloxanes). Preferred siloxanes are those selected from the group consisting of epoxyl, ethoxyl, acrylic, hydroxyl, vinyl, and amine, and mixtures thereof. Especially preferred siloxanes are epoxycyclohexylethylmethylsiloxane-dimethylsiloxane copolymers (ECMS-327 from Gelest), ECMS-924 (Gelest), VDT-5035 (Gelest), EBP-234 (Gelest), AMS-2202 (Gelest), AMS-1203 (Gelest), and mixtures thereof. The composition preferably comprises from about 0.01% to about 8.0% by weight, more preferably from about 0.05% to about 5.0% by weight, and even more preferably from about 0.1% to about 0.8% by weight siloxane, based upon the total weight of the composition taken as 100% by weight. Preferably, the polymer has a weight average molecular weight of from about 200 Daltons to about 4,000,000 Daltons, more preferably from about 1,000 Daltons to about 400,000 Daltons, and even more preferably from about 2,000 Daltons to about 40,000 Daltons.

The nonstick compositions also preferably comprise a catalyst. Suitable catalysts include those selected from the group consisting of photoacid generators, thermal acid generators, and mixtures thereof. Especially preferred catalysts include K-PURE® TAG-2689 from King Industries or 1,1'-azobis(cyclohexanecarbonitrile). The nonstick composition preferably comprises from about 0.002% to about 0.1% by weight catalyst, more preferably from about 0.005% to about 0.1% by weight catalyst, and even more preferably from about 0.008% to about 0.1% by weight catalyst, based upon the total weight of the composition taken as 100% by weight.

The nonstick compositions also comprise an industry-accepted, safe solvent, which is typically a polar solvent. Suitable solvents include those selected from the group consisting of propylene glycol monomethyl ether ("PGME"), d-limonene, ethyl 3-ethoxypropionate, propoxy propanol ("PnP"), propylene glycol methyl ether acetate ("PGMEA"), ethyl lactate, and mixtures thereof. The composition preferably comprises from about 90% to about 99.99% by weight solvent, more preferably from about 92% to about 99.5% by weight solvent, and even more preferably from about 95% to about 99% by weight of this solvent, based upon the total weight of the nonstick composition taken as 100% by weight. One especially preferred solvent mixture is a mixture of PGME (from about 5% to about 40% by weight) and d-limonene (from about 60 to about 95% by weight).

In one embodiment, the nonstick composition is essentially free of silanes. That is, the nonstick composition comprises less than about 0.5%, preferably less than about 0.1%, and more preferably about 0% by weight silanes, based upon the total weight of the nonstick composition taken as 100% by weight. In another embodiment, the nonstick composition consists essentially of, or even consists of, a siloxane, a catalyst, and solvent (preferably a polar solvent). The nonstick composition is formed by simply mixing the above ingredients together.

Bonding Compositions

The bonding material comprises a polymer or a blend of polymers dissolved or dispersed in a solvent system. Other additives such as antioxidants, surfactants, tackifiers, and toners may be included in the bonding material, depending upon the desired coating, bonding, and debonding performance.

In one embodiment, the polymer or blend of polymers are selected from the group consisting of polymers and oligomers of cyclic olefins, epoxies, acrylics, styrenics, vinyl halides, vinyl esters, polyamides, polyimides, polysulfones, polyethersulfones, cyclic olefins, polyolefin rubbers, polyurethanes, ethylene-propylene rubbers, polyamide esters, polyimide esters, polyacetals, and polyvinyl buterol, with the most preferred being cyclic olefin polymers. Suitable cyclic olefin polymers include those prepared from a single monomer, such as norbornene, by metathesis polymerization techniques and then hydrogenated to produce the final product. Particularly preferred COP materials include those commercialized under the names Zeonex® 5000 and Zeonex 480R.

The polymer or polymer blend should be present in the bonding composition at levels of from about 1% by weight to about 60% by weight, more preferably from about 20% by weight to about 40% by weight, and even more preferably from about 25% by weight to about 35% by weight, based upon the total weight of the bonding composition taken as 100% by weight. Preferably, the polymer has a weight average molecular weight of from about 1,000 Daltons to about 200,000 Daltons, more preferably from about 5,000 Daltons to about 150,000 Daltons, and even more preferably from about 10,000 Daltons to about 100,000 Daltons.

Suitable solvent systems include hydrocarbon solvents such as those selected from the group consisting of d-limonene, mesitylene, cyclooctane, and bicyclohexyl. The solvent or solvents should be present in the composition at levels of from about 40% by weight to about 99% by weight, more preferably from about 60% by weight to about 80% by weight, and even more preferably from about 65% by weight to about 75% by weight, based upon the total weight of the composition taken as 100% by weight.

Suitable antioxidants include phenolic antioxidants such as those selected from the group consisting of 1,3,5-trimethyl-2,4,6-tris (3,5-di-tert-butyl-4-hydroxybenzyl) benzene (sold as Irganox® 1330) and benzenepropanoic acid, 3,5-bis(1,1-dimethylethyl)-4-hydroxy-1,6-hexanediyl ester (Irganox® L-109). The antioxidant should be present in the composition from about 0.05% by weight to about 10% by weight, more preferably from about 1% by weight to about 5% by weight, and even more preferably from about 2% by weight to about 4% by weight, based upon the total weight of the composition taken as 100% by weight.

In a preferred embodiment, the bonding compositions are essentially free of cyclic olefin copolymers. That is, the bonding composition comprises less than about 0.5%, preferably less than about 0.1%, and more preferably about 0% by weight cyclic olefin copolymers, based upon the total weight of the bonding composition taken as 100% by weight.

In another embodiment, the bonding compositions are essentially free of pinene and poly(pinene). That is, the bonding composition comprises less than about 0.5%, preferably less than about 0.1%, and more preferably about 0% by weight pinene and poly(pinene), based upon the total weight of the bonding composition taken as 100% by weight.

In another embodiment, the bonding compositions are essentially free of rosin esters. That is, the bonding composition comprises less than about 0.5%, preferably less than about 0.1%, and more preferably about 0% by weight rosin esters, based upon the total weight of the bonding composition taken as 100% by weight.

In another embodiment, the bonding compositions are essentially free of silicones. That is, the bonding composition comprises less than about 0.5%, preferably less than about 0.1%, and more preferably about 0% by weight silicones, based upon the total weight of the bonding composition taken as 100% by weight.

In one embodiment, the bonding compositions consist essentially of, or even consist of, a cyclic olefin polymer, antioxidant, and solvent. In a further embodiment, the bonding compositions consist essentially of, or even consist of, a cyclic olefin polymer, antioxidant, solvent, and any surfactants, toners, and/or tackifiers.

The compositions are formed by simply mixing the above ingredients so as to create a substantially uniform mixture of the ingredients. Preferably, any additional ingredients, such as antioxidants, are dissolved in the solvent first, and the polymer or polymers are added last. Advantageously, this results in the formation of visually clear solutions. Furthermore, wafer pairs bonded with these bonding compositions are able to survive (i.e., there are no defects in the bond line) treatment on a hot plate at about 300° C. for about 30 minutes. These bonding materials also provide excellent overall total thickness variation ("TTV," less than about 3 μm for 50-μm bond line) and can survive a 200° C. PECVD process.

Inventive Method

Referring to FIG. 1(a) (not to scale), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, gallium nitride, aluminum gallium arsenide, aluminum indium gallium phosphide, and indium gallium phosphide. The surfaces of these devices commonly comprise structures (again, not shown) formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. The device surface 14 can also include at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A composition is applied to the first substrate 12 to form a bonding layer 20 on the device surface 14, as shown in FIG. 1(a). Bonding layer 20 has an upper surface 21 remote from first substrate 12, and preferably, the bonding layer 20 is formed directly adjacent the device surface 14 (i.e., without any intermediate layers between the bonding layer 20 and substrate 12). Although bonding layer 20 is shown to cover the entire device surface 14 of first substrate 12, it will be appreciated that it could be present on only portions or "zones" of device surface 14, as shown in U.S. Patent Publication No. 2009/0218560.

The bonding composition can be applied by any known application method, including dip coating, roller coating, slot coating, die coating, screen printing, draw-down coating, or spray coating. Additionally, the coatings may be formed into free-standing films before application to the device substrate or carrier substrate surface. One preferred method involves spin-coating the composition at speeds of from about 200 rpm to about 3,000 rpm (preferably from about 500 rpm to about 2,000 rpm) for a time period of from about 5 seconds to about 120 seconds (preferably from about 10 seconds to about 60 seconds). After the composition is applied, it is preferably heated to a temperature of from about 40° C. to about 250° C., and more preferably from about 90° C. to about 220° C. and for time periods of from about 60 seconds to about 90 minutes (preferably from about 180 seconds to about 60 minutes). Depending upon the composition used to form the bonding layer 20, baking can also initiate a crosslinking reaction to cure the layer 20. In some embodiments, it is preferable to subject the layer to a multi-stage bake process, depending upon the composition utilized. Also, in some instances, the above application and bake process can be repeated on a further aliquot of the composition, so that the first bonding layer 20 is "built" on the first substrate 12 in multiple steps. The resulting layer 20 should have an average thickness (average taken over five measurements) of from about 1 μm to about 200 μm, more preferably from about 10 μm to about 150 μm, and even more preferably from about 30 μm to about 120 μm.

The materials from which bonding layer 20 is formed should be capable of forming a strong adhesive bond with the first and second substrates 12 and 24, respectively. Anything with an adhesion strength of greater than about 50 psig, preferably from about 80 psig to about 250 psig, and more preferably from about 100 psig to about 150 psig, as determined by ASTM D4541/D7234, would be desirable for use as bonding layer 20, with the exemplary compositions having been described above.

A second precursor structure 22 is also depicted in a schematic and cross-sectional view in FIG. 1(*a*). Second precursor structure 22 includes a second substrate 24. In this embodiment, second substrate 24 is a carrier wafer. That is, second substrate 24 has a front or carrier surface 26, a back surface 28, and an outermost edge 30. Although second substrate 24 can be of any shape, it would typically be circular or rectangular in shape and sized similarly to first substrate 12. Preferred second substrates 24 include silicon, sapphire, quartz, metals (e.g., aluminum, copper, steel), and various glasses and ceramics. Suitable carrier substrates should have a similar coefficient of thermal expansion (CTE) to the device substrate.

A composition is applied to the second substrate 24 to form a release (preferably nonstick, in this embodiment) layer 32 on the carrier surface 26, as shown in FIG. 1(*a*). (Alternatively, structure 22 can be provided already formed.) Nonstick layer 32 has an upper surface 33 remote from second substrate 24, and a lower surface 35 adjacent second substrate 24. Preferably, the nonstick layer 32 is formed directly adjacent the carrier surface 26 (i.e., without any intermediate layers between the second bonding layer 32 and second substrate 24).

The nonstick composition can be applied by any known application method, with one preferred method being spin-coating the composition at speeds of from about 500 rpm to about 5,000 rpm (preferably from about 500 rpm to about 2,000 rpm) for a time period of from about 5 seconds to about 120 seconds (preferably from about 30 seconds to about 90 seconds). After the composition is applied, it is preferably heated to a temperature of from about 100° C. to about 300° C., and more preferably from about 150° C. to about 250° C. and for time periods of from about 30 seconds to about 5 minutes (preferably from about 90 seconds to about 3 minutes). Nonstick layer 32 preferably has an average thickness of less than about 1 μm, preferably from about 0.1 μm to about 1 μm, and more preferably from about 1 μm to about 25 μnm.

Referring to structure 22 of FIG. 1(*a*) again, although nonstick layer 32 is shown to cover the entire surface 26 of second substrate 24, it will be appreciated that it could be present on only portions or "zones" of carrier surface 26 similar to as was described with bonding layer 20. Regardless, the dried/cured layer 32 will have a high contact angle with water, which effects polymer release during the debonding step (discussed below). Typical contact angles (measured as described in Example 10) will be at least about 60°, preferably from about 60° to about 120°, more preferably from about 90° to about 110°, and even more preferably from about 100° to about 110°. The nonstick layer 32 also preferably has an adhesion strength of less than about 50 psig, preferably less than about 35 psig, and more preferably from about 1 psig to about 30 psig, determined as described above.

Structures 10 and 22 are then pressed together in a face-to-face relationship, so that upper surface 21 of bonding layer 20 is in contact with upper surface 33 of nonstick layer 32 (FIG. 1(*b*)). While pressing, sufficient pressure and heat are applied for a sufficient amount of time so as to effect bonding of the two structures 10 and 22 together to form bonded stack 34. The bonding parameters will vary depending upon the composition from which bonding layer 20 is formed, but typical temperatures during this step will range from about 100° C. to about 400° C., and preferably from about 150° C. to about 250° C., with typical pressures ranging from about 100 N to about 20,000 N, and preferably from about 1,000 N to about 10,000 N, for a time period of from about 1 minute to about 20 minutes, preferably from about 2 minutes to about 10 minutes, and more preferably from about 3 minutes to about 5 minutes.

In an alternative embodiment, it will be appreciated that bonding layer 20 could be applied to upper surface 33 of nonstick layer 32, using the application process described previously, rather than being applied to surface 14 of first substrate 12. In this instance, the first substrate 12 would then be subjected to the above bonding process so as to bond surface 14 of first substrate 12 to bonding layer 20, which was previously formed on upper surface 33 of nonstick layer 32.

Regardless of which embodiment was used to form the bonded stack 34, the first substrate 12 can now be safely handled and subjected to further processing that might otherwise have damaged first substrate 12 without being bonded to second substrate 24. Thus, the structure can safely be subjected to backside processing such as back-grinding, chemical-mechanical polishing ("CMP"), etching, metallizing, dielectric deposition, patterning (e.g., photolithography, via etching), passivation, annealing, and combinations thereof, without separation of substrates 12 and 24 occurring, and without infiltration of any chemistries encountered during these subsequent processing steps. Not only can bonding layer 20 survive these processes, it can also survive processing temperatures up to about 450° C., preferably from about 200° C. to about 400° C., and more preferably from about 200° C. to about 350° C.

Once processing is complete, the substrates 12 and 24 can be separated by any number of separation methods (not shown). One method involves dissolving the bonding layer 20 in a solvent (e.g., limonene, dodecene, PGME). Alternatively, substrates 12 and 24 can also be separated by first mechanically disrupting or destroying bonding layer 20 using laser ablation, plasma etching, water jetting, or other high energy techniques that effectively etch or decompose bonding layer 20. It is also suitable to first saw or cut through the bonding layer 20 or cleave the layer 20 by some equivalent means. Furthermore, it will be appreciated that other layers (not shown) might be included in the stack, and debonding could take place at that other layer instead of at bonding layer 20. For example, a cleaning layer might be included, and debonding could be carried out by dissolving that cleaning layer. As another example, a laser release layer could be included, and debonding could be effected by laser ablation across that laser release layer.

In situations where a bonding composition other than a cyclic olefin polymer-containing composition is utilized, a suitable separation method involves heating the bonded stack 34 to temperatures of at least about 100° C., preferably from about 150° C. to about 220° C., and more preferably from about 180° C. to about 200° C. It will be appreciated that at these temperatures, the bonding layer 20 will soften, allowing the substrates 12 and 24 to be separated (e.g., by a slide debonding method, such as that described in U.S. Patent Publication No. 2008/0200011, incorporated by reference herein).

It will be appreciated that embodiments using the inventive cyclic olefin polymer-containing compositions avoids the need to heat the bonding layer 20 prior to separation.

That is, after processing has been completed, the stack 34 can be separated without any heat exposure, using a low-force mechanical debonding method. In this instance, the stack 34 is exposed to temperatures of less than about 100° C., preferably less than about 75° C., more preferably less than about 50° C., even more preferably less than about 30° C., and most preferably about ambient temperatures (and certainly no lower than ambient temperatures), prior to and during the separating. It will be understood that a lack of heat exposure during separation does not exclude heat exposure that occurs during the stack processing, prior to separation, but simply that heat exposure stops after processing is complete. So, for example, the heat exposure that might have occurred during stack processing will have ended at least about 60 seconds, and more preferably at least about 300 seconds prior to stack separation.

Regardless of which of the above means is utilized, a low mechanical force (e.g., finger pressure, gentle wedging) can then be applied to completely separate the substrates 12 and 24. After separation, any remaining bonding layer 20 can be removed with a solvent capable of dissolving the particular layer 20. In fact, the inventive bonding layer 20 is highly removable by conventionally-used solvents. That is, the bonding layer 20 can be at least about 95% removed, preferably at least about 98% removed, and more preferably about 100% removed, upon being in contact with a typical cleaning solvent (e.g., d-limonene) at ambient temperatures for a time period of from about 1 minute to about 10 minutes, and preferably from about 3 minutes to about 5 minutes.

In the above embodiments, the nonstick layer 32 is shown on a second substrate 24 that is a carrier wafer, while bonding layer 20 is shown on a first substrate 12 that is a device wafer. It will be appreciated that this substrate/layer scheme could be reversed. That is, the nonstick layer 32 could be formed on first substrate 12 (the device wafer) while bonding layer 20 is formed on second substrate 24 (the carrier wafer). The same compositions and processing conditions would apply to this embodiment as those described above. Additionally, the use of the nonstick layer 32 is optional. Bonding layer 20 could be used alone, without the presence of nonstick layer 32. Bonding layer 20 could also be used with additional bonding materials, structural support layers, other types of release layers (as noted previously, including, but not limited to, mechanical debonding, laser debonding, and thermal or chemical debonding), lamination aid layers, tie layers (for adhesion to initial substrate), contamination control layers, and cleaning layers. Preferred structures and application techniques will be dictated by application and process flow.

Polymeric structural support layers that can be used in combination with the COP bonding materials can comprise monomers, oligomers, polymers, suspended particles, and/or combinations thereof. Examples of suitable monomers, oligomers, and polymers include those selected from the group consisting of cyclic olefin polymers and copolymers, polyimides, polyisobutylenes, hydrocarbon resins, epoxy resins, fluoropolymers, polysulfones, polyethersulfones, polyether ether ketones, polyhydroxyethers, and polyvinylbutyrals. Suitable suspended particles include those selected from the group consisting of alumina, ceria, titania, silica, zirconia, graphite, and nanoparticles, sol-gel particles, and mixtures thereof. Preferred compositions will be structurally rigid at the temperature of use as indicated by glass transition temperature, coefficient of thermal expansion, and modulus.

Mechanical carrier release layers (in addition to, or in lieu of, the polysiloxane layers discussed above) used in conjunction with the COP bonding materials can be composed of monomers, oligomers, and/or polymers. Examples of suitable monomers, oligomers, and polymers include cyclic olefin polymers and copolymers, polyisobutylenes, hydrocarbon resins, epoxy resins, fluoropolymers, polyimides, polysulfones, polyhydroxyethers, polyvinylbutyrals, amorphous fluoropolymers with high atomic fluorine content such as fluorinated siloxane polymers, fluorinated ethylene-propylene copolymers, tetrafluoroethylene hexafluoropropylene, vinylidene fluoride terpolymer, hexafluoropropylene, vinyldene fluoride copolymer, vinylidene fluoride polymer, and polymers with pendant perfluoroalkoxy groups.

Laser carrier release layers used in conjunction with the COP bonding materials can be composed of monomers, oligomers, and/or polymers. One example of a suitable laser release layer is polyimides.

Inventive Methods with Pre-Formed Dry Films and Wet Lamination

In further embodiments, the present invention involves a process of lamination, preferably wet lamination, to apply a thermoplastic or other polymeric dry bonding material film onto a substrate for temporary wafer bonding applications. Generally, the process bonds an active or device substrate to a carrier substrate in order to protect the device substrate during backside processing. Compared to traditional hot roll lamination or vacuum lamination used to apply dry bonding film onto silicon or glass wafer substrates, wet lamination technology enables the lamination of dry bonding material films with higher melt flow characteristics at a lower temperature and reduces voids formation compared to dry film lamination.

As discussed below in further detail, the present invention can be directed to a lamination method for temporary wafer bonding applications that utilizes a step of pre-wetting a substrate and then laminating a bonding film to the pre-wet substrate.

In various embodiments of the present invention, the bonding layer 20 depicted in FIG. 1(a) can be in the form of a pre-formed dry film before application to the device substrate or a carrier substrate surface. These pre-formed bonding films may be a single-layer film of only a polymeric bonding material film. Alternatively, the bonding films could be a two-layer structure comprising a polymeric bonding material film adjacent to a carrier film. In other embodiments, the bonding film could also be a three-layer structure comprising a polymeric bonding material film adjacent to a carrier film on one side and a protection film on the other side. Carrier films can comprise materials including, but not limited to, polyethylene terpthalate (PET) and Kapton® polyimide films.

Advantageously, the pre-formed bonding films can take multiple forms, including, but not limited to, continuous free-standing films, sheets of free-standing film, continuous film coating on a base film, sheets of film coating on a base film, and other shapes dictated by substrate dimension. Generally, the preferred form will be dictated by application and process flow.

The pre-formed bonding films may be produced from any of the compositions described above in regard to the bonding layer 20 depicted in FIG. 1(a). In various embodiments, the pre-formed bonding films can be created from a variety of formulations including, but not limited to, solvent-based dispersions, solvent-based solutions, water-based dispersions, water-based solutions, hot melt polymer systems devoid of volatile solvent constituents, and thermal- or radiation-curable mixtures.

Additionally, the bonding material films can be created using multiple means of formation, including, but not limited to, solvent-cast slot die coating, extrusion slot die coating, screen printing, knife-over-roll coating, gravure printing, flexographic printing, inkjet printing, curtain coating, blown film, spray coating, doctor blade coating, wire wound rod coating, and metering bar coating. For the two-layer and three-layer bonding film, slot-die coating is an especially preferred creation method, and for the single-layer bonding film, extrusion is an especially preferred creation method.

Once the bonding material formulation is deposited in the desired dimension, it can be converted into the bonding film using multiple means, including, but not limited to, solvent evaporation by heat, curing reactions by heat, curing reactions by applied radiation, and curing reactions by moisture. When heat is used to remove the solvent, a drying process of from about 60° C. to about 200° C. is performed after coating to form the dry film. The final thickness of the bonding material film is preferably from about 5 μm to about 100 μm, and more preferably from about 10 μm to about 80 μm. In one embodiment, a protection film is laminated on top of the bonding material film after film formation to protect the bonding material film and avoid oxidation.

The carrier film component can be composed of monomers, oligomers, and/or polymers, and should also be free of volatile components once in film form. Examples of suitable monomers, oligomers, and polymers include those selected from the group consisting of untreated polyethylene terephthalate (PET), silicone treated polyethylene terephthalate, polyimide, polyethylene, and polycarbonate.

The protection film component can be composed of monomers, oligomers, and/or polymers, and should also be free of volatile components once in film form. Examples of suitable monomers, oligomers, and polymers include those selected from the group consisting of untreated polyethylene terephthalate (PET), silicone treated polyethylene terephthalate, polyethylene, and polypropylene.

It should be noted that the pre-formed bonding films are distinct from dicing tapes and other tapes commonly utilized in the art. Unlike dicing tapes, which are adhesive at room temperature and, therefore, may be applied at such temperatures; the pre-formed bonding films only adhere to other substrates when heated during a lamination or compression process. In other words, the pre-formed bonding films do not generally exhibit adhesive properties at room temperatures. For instance, prior to being subjected to any lamination process, compression process, or any other process used to form the stacks described herein, the pre-formed bonding films may exhibit an adhesive strength at 25° C. of less than 1 B, preferably less than 0 B, as measured according to ASTM D3359.

The pre-formed bonding film can be applied to the first or second substrate using any known method, with preferred methods including hot roll lamination and compression bonding. In one embodiment, a pre-wet step is utilized prior to the application of the bonding material film to the carrier or device substrate. If a three-layer film structure is used, then the protective film is removed prior to the lamination of the film to the substrate.

The utilization of a wet lamination system allows the lamination to take place at a lower temperature, which can reduce stress on the bonded substrates and increase throughput.

Figure 2:
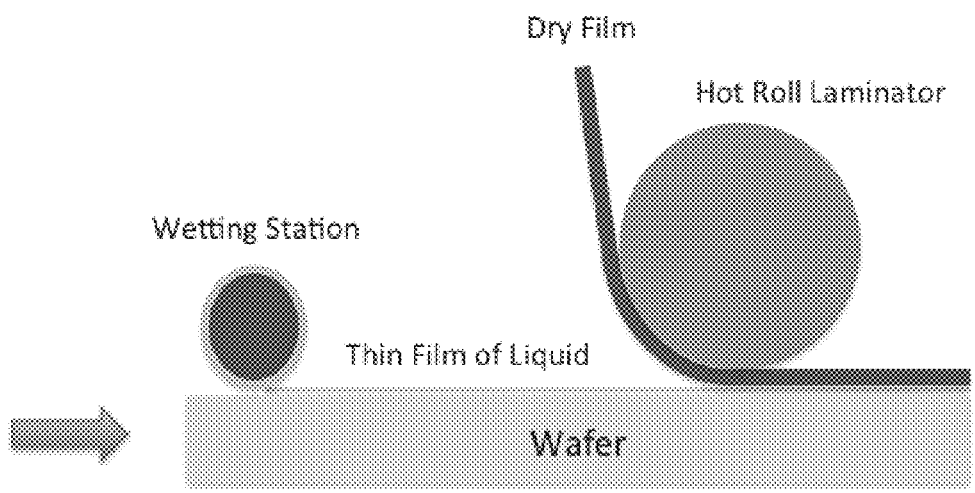
FIG. 2 is a schematic depicting a wet lamination system.

When a pre-wet step is used, a wetting station can be utilized to apply the pre-wet liquid. One exemplary wetting station comprises a sponge roller made of polyurethane foam or melamine foam that absorbs the pre-wetting liquid first then transfers that pre-wetting liquid onto the surface of the substrates to form a thin layer of liquid film prior to lamination. This wetting station also serves to absorb or transfer excess liquid off of the substrate surface. Alternatively, the pre-wet liquid could be cast on the substrate, such as by spin coating. The thickness of the pre-wet liquid is preferably from about 0.1 μm to about 5 μm. FIG. 2 shows a diagram of a wetting station used in conjunction with a hot roll laminator.

Generally, the pre-wetting liquid acts to displace air to eliminate void formation and also plasticize the bonding material film and make it adhere more strongly to the substrate. The pre-wetting liquid could be a non-polar organic liquid such as d-limonene or dodecene, or it could be a polar organic liquid such as cyclopentanone or cyclohexanone.

The bonding film is then applied onto the pre-wet substrate. One especially preferred application method involves hot roll laminating at a temperature from about 60° C. to about 200° C., preferably from about 80° C. to about 140° C., and more preferably from about 80° C. to about 120° C., with a lamination speed of from about 0.1 meter per minute to about 3 meters per minute, and preferably from about 0.3 meter per minute to about 2 meters per minute, and a lamination pressure of from about 0 kg/cm$^2$ to about 5 kg/cm$^2$, and preferably from about 1 kg/cm$^2$ to about 3 kg/cm$^3$.

If a two-layer bonding film is utilized, the carrier film can be removed after lamination. The substrate is then optionally baked at a temperature from about 50° C. to about 250° C., preferably from about 100° C. to about 200° C., for a time of from about 0.5 minutes to about 20 minutes, preferably from about 1 minute to about 10 minutes.

Alternatively, the dry bonding film may be cut to the size of the device and carrier substrate and placed between the substrates before bonding them in a face-to-face configuration, rather than laminating the bonding film to one substrate and then bonding to the second substrate.

The first and second substrates are then bonded in a face-to-face configuration. One preferred method of bonding the first and second substrates is by using a compression bonder. Preferred bonding temperature are from about 50° C. to about 370° C., more preferably from about 100° C. to about 250° C., most preferably from about 150° C. to about 200° C. Preferred bonding forces are from about 500 N to about 8000 N, more preferably from about 1000 N to about 5000 N, and most preferably from about 2000 N to about 3000 N. Preferred bonding times are from about 30 seconds to about 5 minutes, and more preferably from about 2 minutes to about 4 minutes.

The bonded substrates can then be subjected to subsequent thinning or other processing. For example, the device substrate can be thinned to a thickness of from about 50 μm to about 100 μm. After thinning, typical backside processing, including backgrinding, photolithography, via etching, passivation, metallization, PECVD, and combinations thereof, may be performed.

After backside processing has occurred, the device substrate can be separated from the carrier substrate. The substrates may be separated by heating to a temperature sufficient to soften the bonding layer. Alternatively, the bonding material or a release layer may be removed or weakened by the use of a laser, after which the substrates may be separated. Regardless of whether the bonding or release composition is softened or decomposed, the separation can be accomplished by simply applying force to slide or lift the substrates apart.

Following separation, the bonding composition remaining on the substrates can be easily removed by rinsing with solvent followed by spin-drying or simply peeling the bonding composition layer film off the substrate.

Optionally, the front side of the first and/or second substrates may be treated to form a release surface. Suitable treatment methods include coating with a laser sensitive or laser decomposable material, or coating with a fluoro- or silane-based releasing agent.

It will be appreciated that the use of a pre-formed dry film to bond substrates offers some important advantages over the prior art. For example, this aspect of the invention allows one to form a low-TTV film prior to application, with that film remaining solvent-soluble after processing. These films also allowed for much thicker applications than typical spin-coated bonding materials.

EXAMPLES

The following examples set forth preferred methods in accordance with the invention. It is to be understood, however, that these examples are provided by way of illustration and nothing therein should be taken as a limitation upon the overall scope of the invention.

Example 1

Formulation of a 0.5% ECMS-327 Siloxane Solution

To a 250 ml glass bottle, 0.02 gram of K-PURE® TAG-2689 (King Industries Inc. Norwalk, Conn.) and 19.9 grams of propylene glycol monomethyl ether ("PGME," Ultra Pure, Inc., Castroville, Calif.) were added. The solution was mixed for 5-10 minutes until all of K-PURE® TAG-2689 dissolved. Next, 79.58 grams of d-limonene (Florida Chemical Co. Winter Haven, Fla.) and 0.5 gram of ECMS-327 (polysiloxane, structure shown below; Gelest, Morrisville, Pa.) were then added to the solution. The final solution was mixed for 30-60 minutes until all of polysiloxane was dissolved, after which the solution was filtered once through 0.1-μm disk filter (Whatman Inc., Florham Park N.J.). The total concentration of polysiloxane in this solution was 0.5% by weight.

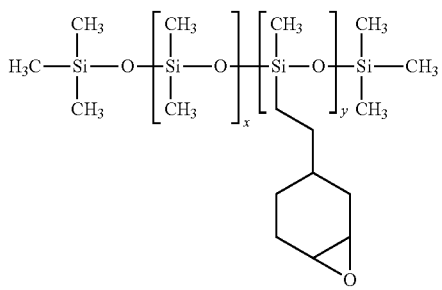

Example 2

Formulation of a 0.5% ECMS-924 Siloxane Solution

To a 250 ml glass bottle, 0.02 gram of K-PURE® TAG-2689 (King Industries Inc. Norwalk, Conn.) and 19.9 grams of PGME (Ultra Pure, Inc., Castroville, Calif.) were added. The solution was mixed for 5-10 minutes until all of K-PURE® TAG-2689 dissolved. 79.58 grams of d-limonene (Florida Chemical Co. Winter Haven, Fla.) and 0.5 gram of ECMS-924 (polysiloxane, Gelest, Morrisville, Pa.) were then added to the solution. (The structure of this polymer is similar to that shown for Example 1, with the difference in numbers denoting a difference in molecular weights.) The final solution was mixed for 30-60 minutes until all of polysiloxane dissolved and then was filtered once through 0.1-μm disk filter (Whatman Inc., Florham Park N.J.). The total concentration of polysiloxane in this solution was 0.5% by weight.

Example 3

Formulation of a 0.5% VDT-5035 Siloxane Solution

To a 250 ml glass bottle, 100 grams of PGME (Ultra Pure, Inc., Castroville, Calif.), 0.5 gram of VDT-5035 (Gelest, structure shown below; Morrisville, Pa.), and 0.025 gram of 1,1'-azobis(cyclohexanecarbonitrile) (Sigma-Aldrich, St Louis, Mo.) were added. The final solution was mixed for 30-60 minutes until all of polysiloxane dissolved. The total concentration of polysiloxane in this solution was about 0.5% by weight.

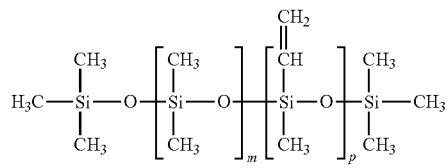

Example 4

Formulation of a 0.5% EBP-234 Siloxane Solution

To a 250 ml glass bottle, 100 grams of PGME (Ultra Pure, Inc., Castroville, Calif.), 0.5 gram of EBP-234 (Gelest, structure shown below; Morrisville, Pa.), and 0.027 gram of K-PURE® TAG-2689 were added. The final solution was mixed for 30-60 minutes until all of polysiloxane dissolved. The total concentration of polysiloxane in this solution was about 0.5% by weight.

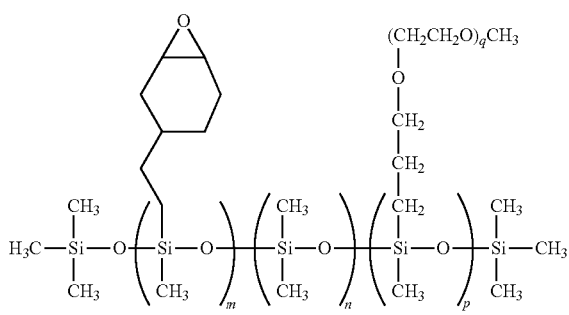

Example 5

Formulation of a 0.6% ECMS-327 Siloxane Solution

To a 250 ml plastic bottle, 0.02 gram of K-PURE® TAG-2689 (King Industries Inc. Norwalk, Conn.) and 4.969 grams of PGME (Ultra Pure, Inc., Castroville, Calif.) were added. The solution was mixed for 5-10 minutes until all of K-PURE® TAG-2689 dissolved. 94.411 grams of 3-ethoxypropionate (EEP, Sigma-Aldrich Inc., St. Louis, Mo.) and 0.6 gram of ECMS-327 (polysiloxane, Gelest, Morrisville, Pa.) were then added to the solution. The final solution was mixed for 30-60 minutes until all of polysiloxane dissolved and then was filtered once through a 0.1-μm disk filter (Whatman Inc., Florham Park N.J.). The total concentration of polysiloxane in this solution was 0.6% by weight.

Example 6

Formulation of a 0.1% ECMS-327 Siloxane Solution

To a 250 ml plastic bottle, 0.004 gram of K-PURE® TAG-2689 (King Industries Inc. Norwalk, Conn.) and 4.9948 grams of PGME (Ultra Pure, Inc., Castroville, Calif.) were added. The solution was mixed for 5-10 minutes until all of K-PURE® TAG-2689 dissolved. Next, 94.9012 grams of 3-ethoxypropionate (EEP, Sigma-Aldrich Inc., St. Louis, Mo.) and 0.1 gram of ECMS-327 (polysiloxane, Gelest, Morrisville, Pa.) were then added to the solution. The final solution was mixed for 30-60 minutes until all of polysiloxane dissolved and then was filtered once through 0.1-μm disk filter (Whatman Inc., Florham Park N.J.). The total concentration of polysiloxane in this solution was 0.1% by weight.

Example 7

Formulation of a 0.2% ECMS-327 Siloxane Solution

To a 250 ml plastic bottle, 0.008 gram of K-PURE® TAG-2689 (King Industries Inc. Norwalk, Conn.) and 4.9896 grams of PGME (Ultra Pure, Inc., Castroville, Calif.) were added. The solution was mixed for 5-10 minutes until all of K-PURE® TAG-2689 dissolved. Next, 94.8024 grams of 3-ethoxypropionate (EEP, Sigma-Aldrich Inc., St. Louis, Mo.) and 0.2 gram of ECMS-327 (polysiloxane, Gelest, Morrisville, Pa.) were added to the solution. The final solution was mixed for 30-60 minutes until all of the polysiloxane had dissolved, followed by filtering once through 0.1-μm disk filter (Whatman Inc., Florham Park N.J.). The total concentration of polysiloxane in this solution was 0.2% by weight.

Example 8

Formulation of a 0.6% AMS-2202 Siloxane Solution

To a 250 ml plastic bottle, 49.7 grams of PGME (Ultra Pure, Inc., Castroville, Calif.) and 0.3 gram of AMS-2202 (Gelest, structure shown below; Morrisville, Pa.) were added. The final solution was mixed for 30-60 minutes until all of polysiloxane dissolved. The total concentration of polysiloxane in this solution was about 0.6% by weight.

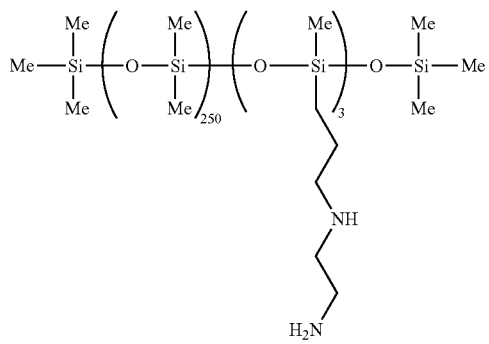

Example 9

Formulation of a 0.6% AMS-1203 Siloxane Solution

To a 250 ml plastic bottle, 49.7 grams of PGME (Ultra Pure, Inc., Castroville, Calif.) and 0.3 gram of AMS-1203 (Gelest, Morrisville, Pa.) were added. The final solution was mixed for 30-60 minutes until all of polysiloxane dissolved. The total concentration of polysiloxane in this solution was about 0.6% by weight.

Example 10

Testing of Siloxane Solutions

The solutions formulated in Examples 1 to 9 were spin-coated onto 100-mm silicon wafers by spinning at 1,500 rpm with 10,000 rpm/s ramp for 30 seconds, and then baked at 205° C. for 60 seconds. All wafers had good coat quality via visual observation. The thickness was measured with ellipsometer. The contact angle with water was measured using VCA Optima Tool from AST Products, Inc. Billerica, Mass. The results are listed in the Table 1.

TABLE 1

Solution appearance, thickness, and contact angle of siloxane solutions.

| Sample | Solution appearance | Thickness, Å | Contact angle |
|---|---|---|---|
| Example 1 | Clear | 123 | 105° |
| Example 2 | Clear | 105 | 101° |
| Example 3 | Clear | 108 | 106° |
| Example 4 | Clear | 104 | 96° |

TABLE 1-continued

Solution appearance, thickness, and contact angle of siloxane solutions.

| Sample | Solution appearance | Thickness, Å | Contact angle |
|---|---|---|---|
| Example 5 | Clear | 120 | 104° |
| Example 6 | Clear | 16 | 96° |
| Example 7 | Clear | 32 | 106° |
| Example 8 | Clear | 287 | 103° |
| Example 9 | Clear | 305 | 103° |

Example 11

Bonding Testing of Siloxane Solution from Example 1 with Cylic Olefin Polymer

The solution formulated in Example 1 was spin-coated onto 200-mm silicon wafers by spinning at 1,500 rpm with 10,000 rpm/s ramp for 30 seconds, and then baked at 205° C. for 60 seconds. The contact angle of the fully-coated wafer was determined to be 105. A 50-μm film of the cyclic olefin polymer bonding material from Example 16 was coated onto another 200-mm silicon wafer by spin-coating at 1,000 rpm with a 3,000 rpm/s ramp for 30 seconds, and then baking at 60° C. for 3 minutes, 160° C. for 2 minutes, and 205° C. for 2 minutes.

The two wafers were bonded in a face-to-face relationship at 200° C. for 3 minutes in a heated vacuum and under pressure chamber with 1,800 N of bonding pressure on an EVG510 bonder. After cooling to room temperature, the bonded wafers were separated easily by a peeling process using a ZoneBOND® separation tool.

Example 12

Bonding Testing of Siloxane Solution from Example 5 with Cyclic Olefin Polymer

The solution formulated in Example 5 was spin-coated onto 200-mm silicon wafers by spinning at 1,500 rpm with 10,000 rpm/s ramp for 30 seconds, and then baked at 205° C. for 60 seconds. The contact angle of the fully-coated wafer was measured to be 105. A 50-μm film of the cyclic olefin polymer bonding material from Example 16 was coated onto another 200-mm silicon wafer by spin-coating at 1,000 rpm with a 3,000 rpm/s ramp for 30 seconds, and then baking at 60° C. for 3 minutes, 160° C. for 2 minutes, and 205° C. for 2 minutes.

The two wafers were bonded in a face-to-face relationship at 200° C. for 3 minutes in a heated vacuum and under pressure chamber with 1,800 N of bonding pressure on an EVG510 bonder. After cooling to room temperature, the bonded wafers were separated easily by a peeling process using a ZoneBOND® separation tool.

Example 13

Bonding and Backside Processing Testing of Siloxane Solution from Example 5 with Cyclic Olefin Polymer The solution formulated in Example 5 was spin-coated onto 200-mm silicon wafers by spinning at 1,500 rpm with 10,000 rpm/s ramp for 30 seconds, and then baked at 205° C. for 60 seconds. The contact angle of the fully-coated wafer was measured to be 105. A 50-μm film of the cyclic olefin polymer bonding material from Example 16 was coated onto another 200-mm silicon wafer by spin-coating at 1,000 rpm with a 3,000 rpm/s ramp for 30 seconds, and then baking at 60° C. for 3 minutes, 160° C. for 2 minutes, and 205° C. for 2 minutes.

The two wafers were bonded in a face-to-face relationship at 200° C. for 3 minutes in a heated vacuum and under pressure chamber with 1,800 N of bonding pressure on an EVG510 bonder. The wafer pair was then cooled down to room temperature. The wafer pair was subjected to a back-grinding process, which thinned the device wafer to 50 μm in thickness. The wafer pair was then heat-treated for 30 minutes at 260° C. and cooled again to room temperature.

The bonded wafers were separated easily by a peeling process using a ZoneBOND® separation tool.

Example 14

Bonding Testing of Siloxane Solution from Example 5 with WaferBOND® HT-10.10 Material The solution formulated in Example 5 was spin-coated onto 200-mm silicon wafers by spinning at 1,500 rpm with a 10,000 rpm/s ramp for 30 seconds, and then baked at 205° C. for 60 seconds. The contact angle of the fully-coated wafer was measured to be 105. A 50-μm film of Wafer-BOND® HT-10.10 material (Brewer Science, Inc.) was coated onto another 200-mm silicon wafer by spin-coating at 400 rpm with a 500 rpm/s ramp for 35 seconds, and then baking at 120° C. for 3 minutes and 180° C. for 4 minutes.

The two wafers were bonded in a face-to-face relationship at 180° C. for 3 minutes in a heated vacuum and under pressure chamber with 1,800 N of bonding pressure on an EVG510 bonder. After cooling down to room temperature, the bonded wafers were separated easily by a peeling process using a ZoneBOND® separation tool.

Example 15

Bonding and Backside Processing Testing of Siloxane Solution from Example 5 with WaferBOND® HT-10.10 Material The solution formulated in Example 5 was spin-coated onto 200-mm silicon wafers by spinning at 1,500 rpm with 10,000 rpm/s ramp for 30 seconds, and then baked at 205° C. for 60 seconds. The contact angle of the fully-coated wafer was measured to be 105. A 50-μm film of Wafer-BOND® HT-10.10 material (Brewer Science, Inc.) was coated onto another 200-mm silicon wafer by spin-coating at 400 rpm with a 500 rpm/s ramp for 35 seconds, and then baking at 120° C. for 3 minutes and 180° C. for 4 minutes.

The two wafers were bonded in a face-to-face relationship at 180° C. for 3 minutes in a heated vacuum and under pressure chamber with 1,800 N of bonding pressure on an EVG510 bonder. The wafer pair was then cooled down to room temperature. The wafer pair was subjected to a back-grinding process, which thinned the device wafer to 50 μm thickness. The wafer pair was then heat treated for 30 minutes at 260° C. and cooled again to room temperature. The bonded wafers were then separated easily by a peeling process using a ZoneBOND® separation tool.

Example 16

Formulation of Bonding Material 1

First, 1.8 grams of Irganox® 1330 antioxidant (Sigma-Aldrich, Mo.) was dissolved in 138.2 grams of d-limonene (Florida Chemical Company, Fla.). Then, 60 grams of ZEONEX® 5000 cyclic olefin polymer (Zeon Corporation, Japan) was added to the solution, and the solution was rotated on a rotating wheel until the polymer was fully dissolved. The solution was then filtered with a 0.2-μm Meissner Vangard filter.

Example 17

Formulation of Bonding Material 2

First, 1.8 grams of Irganox® 1330 antioxidant was dissolved in 140 grams of d-limonene. Then, 54 grams of ZEONEX® 5000 and 6 grams of ZEONEX® 480R cyclic olefin polymers (Zeon Corporation, Japan) were added to the solution, and the solution was rotated on a rotating wheel until the polymer was fully dissolved. The solution was then filtered with a 0.2-μm Meissner Vangard filter.

Example 18

Thermal Stability Testing of Bonding Material

Figure 3:
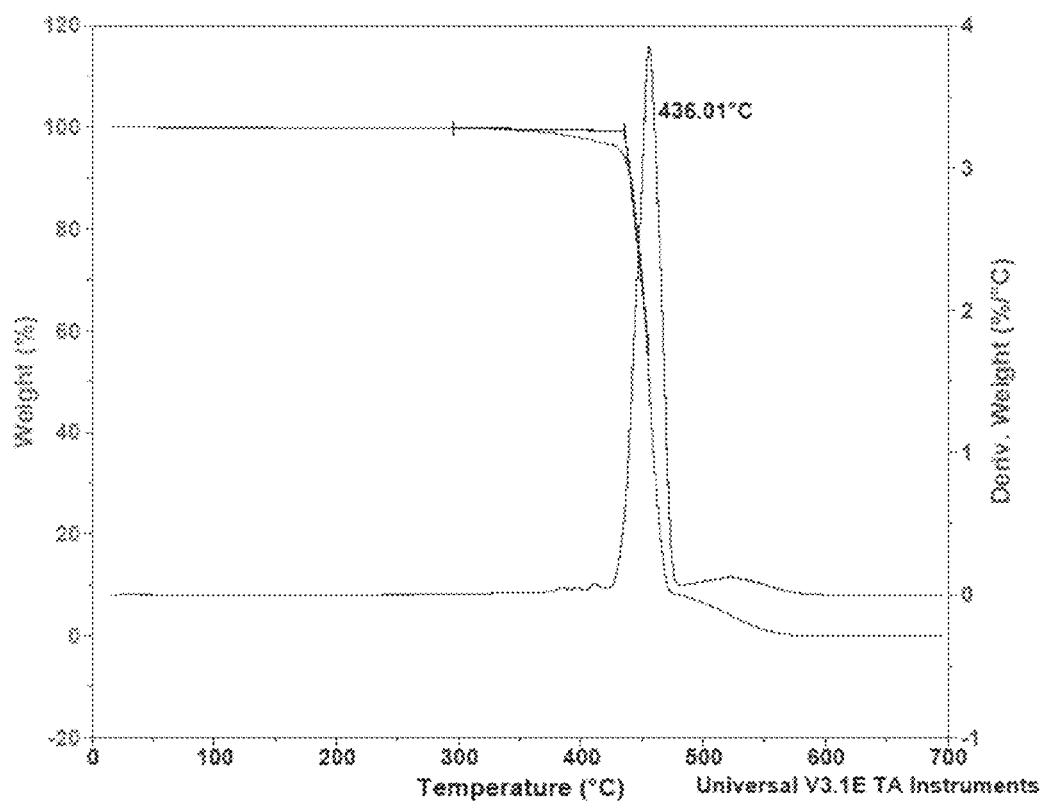
FIG. 3 is a graph depicting the thermogravimetric analysis ("TGA") data of the bonding material from Example 18.

The bonding material from Example 16 was spin coated onto an eight-inch wafer at 750 rpm, with 3,000 rpm/s acceleration for 30 seconds. The wafer was then baked at 60° C. for 2 minutes, 160° C. for 2 minutes, and 200° C. for 13 minutes. The film was scratched off of the wafer for TGA. TGA was performed using a 10° C./min ramp in air. The result is in FIG. 3. The decomposition temperature was 436° C., and the 2% weight loss point was at 363° C.

Example 19

Bonding of Substrates Using Bonding Material

Figure 4:
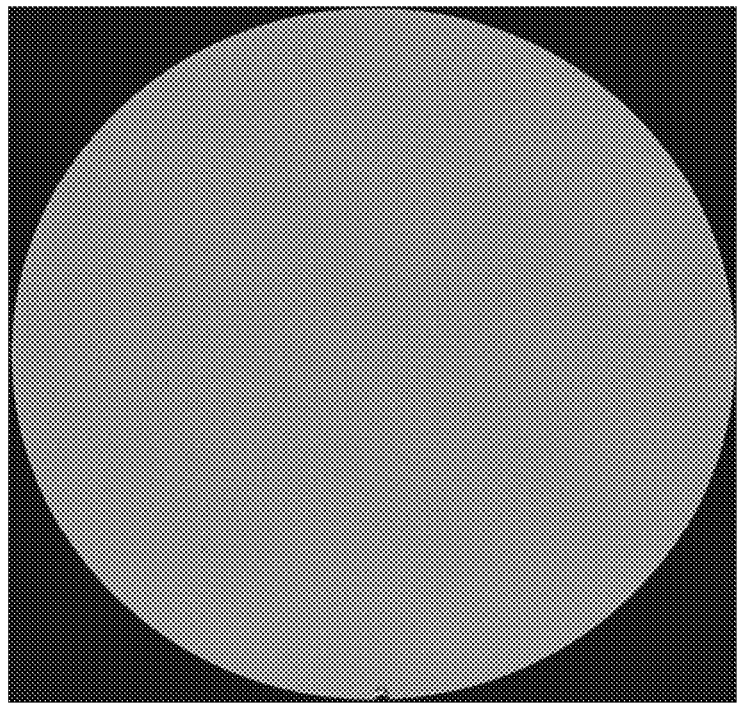
FIG. 4 is a scanning acoustic microscope image of the wafer bonded in Example 19.

In this Example, a 50-μm coat of the bonding material from Example 16 was coated on an eight-inch Si wafer by spin coating the material at 1,000 rpm, with 3,000 rpm/s acceleration for 30 seconds. The wafer was then baked at 60° C. for 3 minutes, 160° C. for 2 minutes, and 200° C. for 2 minutes. A carrier Si wafer was coated with Brewer Science® ZoneBOND® 3500-02 anti-stiction material by spin coating at 1,250 rpm, with 250 rpm/s acceleration for 30 seconds. The carrier wafer was then baked at 160° C. for 3 minutes. The wafer pair was then bonded at 200° C., 1,800 N for 3 minutes under vacuum (<5 mbar) using an EVG Model 510 bonder. The bonded pair was examined with a scanning acoustic microscope from Sonoscan. The images showed that the wafer pair was bonded well, and there were no voids detected (FIG. 4).

Example 20

Heat Treatment of Wafer Pair Bonded with Bonding Material from Example 16

Figure 5:
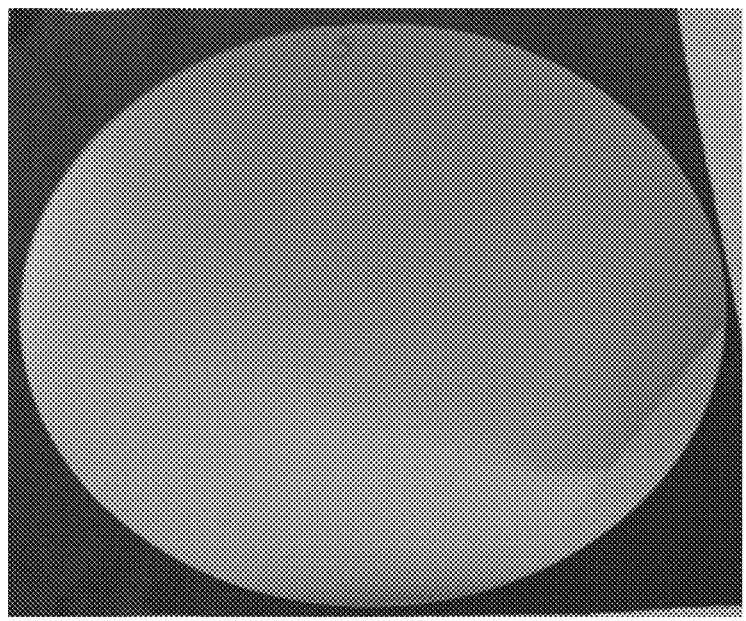
FIG. 5 is a photograph of the wafer pair of Example 20 after 300° C. heat treatment.

In this Example, a 50 μm coating of the bonding material from Example 16 was coated on an eight-inch silicon wafer by spin coating the material at 1,000 rpm, with 3,000 rpm/s acceleration for 30 seconds. The wafer was then baked at 60° C. for 3 minutes, 160° C. for 2 minutes, and 205° C. for 2 minutes. A glass carrier wafer was coated with Brewer Science® ZoneBOND® 3500-02 anti-stiction material by spin coating at 1,250 rpm, with 250 rpm/s acceleration for 30 seconds. The carrier wafer was then baked at 160° C. for 3 minutes. The wafer pair was then bonded at 200° C., 1,800 N for 3 minutes under vacuum (<5 mbar) in an EVG510 bonder. The bonded pair was then placed on a hot plate at 300° C. for 30 minutes. There were no voids or defects observed after the heat treatment, as can be seen in FIG. 5. After heat treatment, the wafers were separated with a Brewer Science® peel debonder without edge soaking or cleaning.

Example 21

PECVD of Bonded, Thinned Wafer Pair

Figure 6:
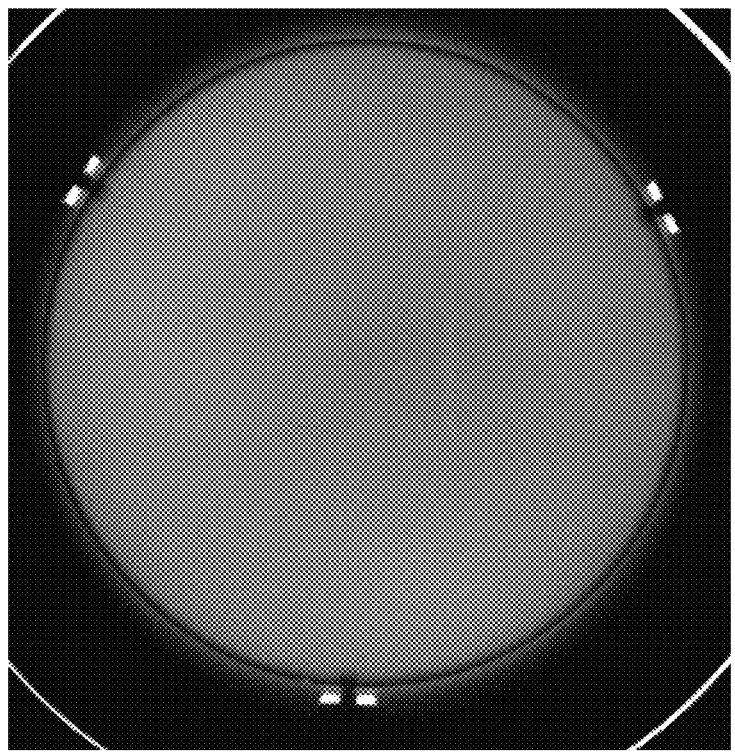
FIG. 6 is an IR image of the thinned wafer pair of Example 21 after a PECVD process.

In this Example, a 50-μm coat of the bonding material from Example 16 was coated on an eight-inch Si wafer by spin coating the material at 1,000 rpm, with 3,000 rpm/s acceleration for 30 seconds. The wafer was then baked at 60° C. for 3 minutes, 160° C. for 2 minutes, and 200° C. for 2 minutes. A glass carrier was coated with Brewer Science® ZoneBOND® 3500-02 anti-stiction material by spin coating at 1,250 rpm, with 250 rpm/s acceleration for 30 seconds. The carrier wafer was then baked at 160° C. for 3 minutes. The wafer pair was then bonded at 200° C., 1,800 N for 3 minutes under vacuum (<5 mbar) in EVG510 bonder. The device wafer was thinned to 50-μm thickness using a commercial DISCO® brand wafer grinding tool. A SiOx layer was deposited on the thinned wafer in a PECVD chamber at 200° C. for 2 minutes. The wafer pair was bonded very well, and there were no voids detected by IR observation (FIG. 6).

Example 22

Cleaning of Bonding Material After Debonding

In this Example, a 50-μm film of the material from Example 16 was coated on an eight-inch blank silicon wafer. The silicon carrier wafer was coated with Brewer Science® ZoneBOND® 3500-02 anti-stiction material. The wafer pair was then bonded at 210° C., 1,800 N for 3 min under vacuum (<5 mbar) using an EVG Model 510 bonder. The wafer pair was then debonded on Brewer Science peel debonder at room temperature. The device wafer was then cleaned on a Brewer Science® Cee® 200FX spin coater with 400 ml of d-limonene using a central dispense process with the conditions listed in Table 2. After cleaning, the wafer was visually clean under green light with no residue.

TABLE 2

Cleaning process to remove 50-μm layer of bonding material after debonding.

| Step | Spin speed rpm | Acceleration rpm/sec | Time second | Dispense |
|---|---|---|---|---|
| 1 | 500 | 250 | 10 | d-limonene |
| 2 | 20 | 300 | 20 | d-limonene |
| 3 | 0 | 20 | 60 | |
| 4 | 1000 | 750 | 240 | d-limonene |
| 5 | 1200 | 500 | 35 | |

Example 23

Heat Treatment of Wafer Pair Bonded with Material from Example 17

Figure 7:
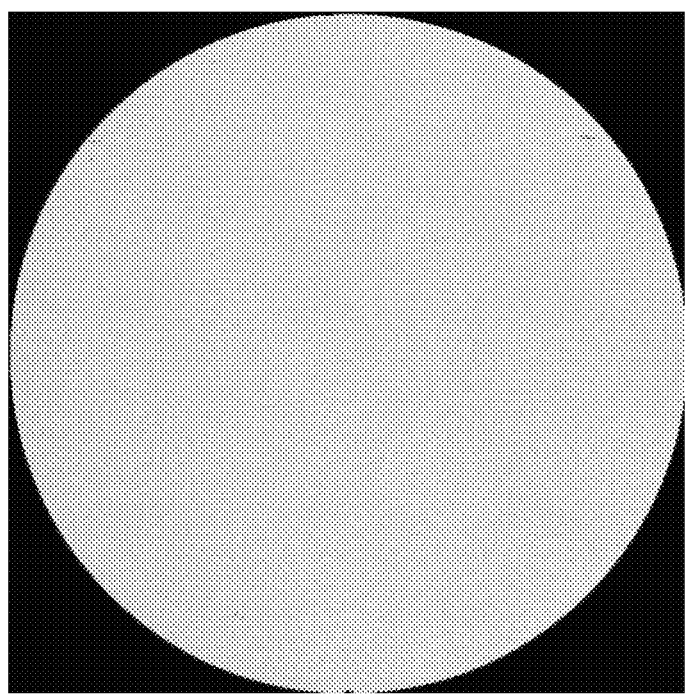
FIG. 7 is a scanning acoustic microscope image of the bonded wafer pair of Example 23 after a 260° C., 30-minute heat treatment on a hotplate.

In this Example, a 44-μm coating of the bonding material from Example 17 was coated on an eight-inch silicon wafer by spin coating the material at 1,000 rpm, with 3,000 rpm/s acceleration for 30 seconds. The wafer was then baked at 60° C. for 3 minutes, 160° C. for 2 minutes, and 200° C. for 2 minutes. A carrier Si wafer was coated with the release material of Example 7 by spin coating at 1,500 rpm, with 10,000 rpm/s acceleration for 30 seconds. The carrier wafer was then baked at 205° C. for 1 minutes. The wafer pair was then bonded at 200° C., 1,800 N for 3 minutes under vacuum (<5 mbar) using an EVG510 bonder. The bonded pair was then placed on a hot plate at 260° C. for 30 minutes. There were no voids or defects observed after the heat treatment as can be seen in FIG. 7. After heat treatment, the wafers were separated with a Brewer Science® peel debonder without edge soaking or cleaning.

Example 24

Laser Debonding of Wafer Pair Bonded with Material from Example 16 after Heat Treatment In this example, a 50-μm coating of the bonding material from Example 16 was coated on an eight-inch silicon wafer by spin coating the material at 1,000 rpm, with 3,000 rpm/s acceleration for 30 seconds. The wafer was then baked at 60° C. for 3 minutes, 160° C. for 2 minutes, and 200° C. for 2 minutes. A carrier glass wafer was coated with an experimental polyimide laser release material (Brewer Science, Inc.) by spin coating at 2,500 rpm with 5,000 rpm/s acceleration for 60 seconds. The carrier wafer was baked at 300° C. for 5 minutes, and the wafer pair was then bonded at 200° C. and 1,800 N for 3 minutes under vacuum (<5 mbar) using an EVG510 bonder. There were no voids or defects observed by visual inspection after bonding. The wafer pair was then laser debonded at a wavelength of 308 nm and a fluence of 175 mJ/cm$^2$ on a SUSS laser debonding tool. A second wafer pair, coated and bonded at the same conditions as above, was also successfully laser debonded on a Kingyoup laser debonding tool at 3.2 W. The wavelength of the Kingyoup tool was 355 nm.

Example 25

Creation of Bonding Material Films

A slot die coater (Asia Metal Industries Inc, Taiwan) was used to cast BrewerBOND® 305 or 305-30 material onto a 50 μm polyethylene terephthalate (PET, BP21, Nan Ya Plastics Corporation, Taiwan) carrier film using the processing parameters shown in Table 3. The solvent-cast bonding material composition was dried in a hot air oven at 150° C. for about 10 minutes to obtain the pre-formed bonding material film with thicknesses from 5 μm to 100 μm.

TABLE 3

| BrewerBOND® Material | Dry Film Thickness | Viscosity | Die Gap | Pump Speed | Line Speed |
| --- | --- | --- | --- | --- | --- |
| 305 | 85 μm | 7000 cP | 500 μm | 22.4 rpm | 0.5 m/min |
| 305-30 | 50 μm | 3000 cP | 300 μm | 11.4 rpm | 0.5 m/min |
|  | 20 μm |  | 140 μm | 18.8 rpm | 1.0 m/mi |

Example 26

Hot Roll Lamination of Dry Bonding Material Film at 200° C.

Figure 8:
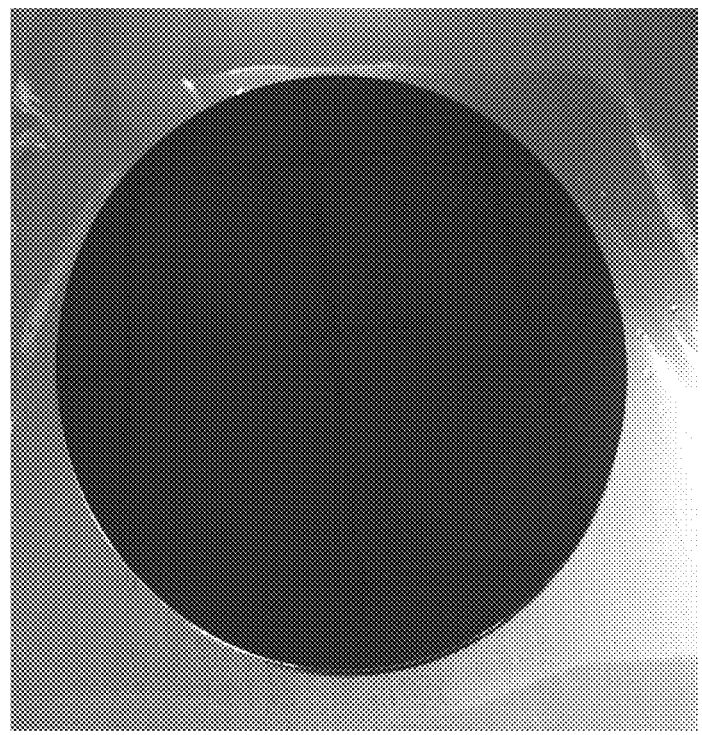
FIG. 8 is a photograph of the wafer of Example 26 after lamination at 200° C.

A 50 μm thermoplastic dry bonding film made in Example 25 was then laminated onto a 200 mm silicon wafer using a Tai-Ing, TI-L730 hot roll laminator under following conditions: roller temp of 200° C., speed of 0.5 meter per minute, and pressure of 1 kg/cm$^2$. The base polyethylene terephthalate (PET) film was removed from the laminated wafer after lamination. No voids or delamination were detected after removal of the base PET film. FIG. 8 shows an image of the bonding film laminated onto the silicon wafer.

Example 27

Hot Roll Lamination of Dry Bonding Material Film at 160° C.

Figure 9:
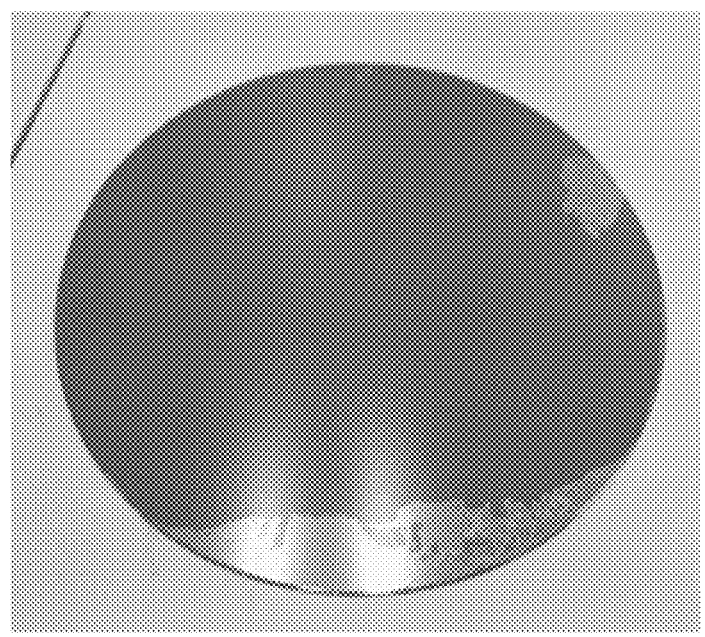
FIG. 9 is a photograph of the wafer of Example 27 after lamination at 160° C.

A 50 μm thermoplastic dry bonding film made in Example 25 was then laminated onto a 200-mm silicon wafer using a Tai-Ing, TI-L730 hot roll laminator under following conditions: roller temp of 160° C., speed of 0.25 meter per minute, and pressure of 1 kg/cm$^2$. The base PET film was removed from the laminated wafer after lamination. There was significant delamination at the wafer edge after removal of the base PET film. FIG. 9 shows an image of the bonding film partially laminated onto the silicon wafer.

Example 28

Hot Roll Lamination of Dry Bonding Material Film on Glass Panel

A 20 μm thermoplastic dry bonding film made in Example 25 was then laminated onto a 350 mm×400 mm of glass panel using a Tai-Ing, TI-L730 hot roll laminator under following conditions: roller temp of 200° C., speed of 0.5 meter per minute, and pressure of 1 kg/cm$^2$. The base PET film was removed from the laminated panel after lamination.

Example 29

Vacuum Lamination of Dry Bonding Material Film at 150° C.

Figure 10:
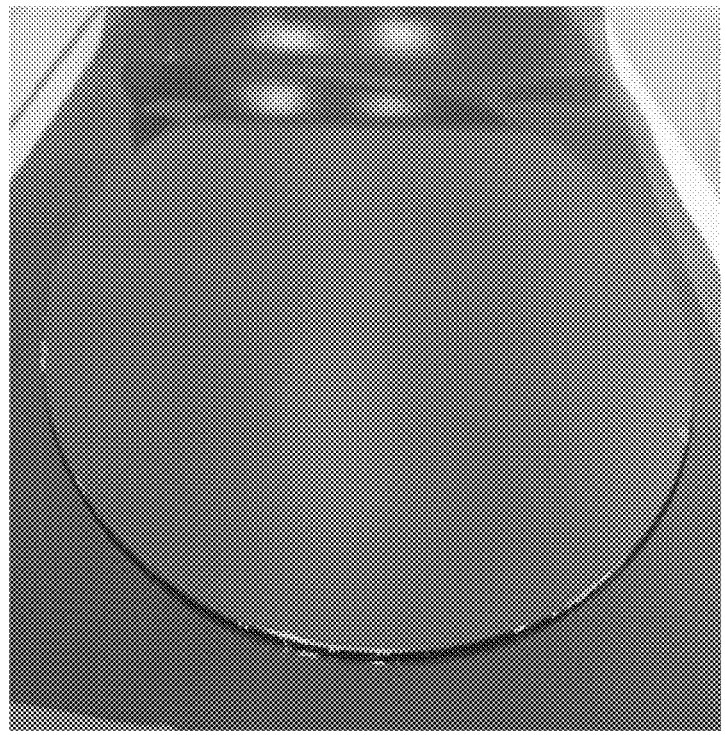
FIG. 10 is a photograph of the wafer of Example 29 after vacuum lamination at 150° C.

A 75 μm thermoplastic dry bonding film made in Example 25 was then laminated onto a 200 mm silicon wafer using vacuum laminator under following conditions: lamination temperature of 150° C., lamination force of 2400 N, and lamination time of 3 minutes. The base PET film was removed from the laminated wafer after lamination. FIG. 10 shows an image of the bonding film partially laminated onto the silicon wafer.

Example 30

Bonding Using Dry Bonding Material Film

Figure 11:
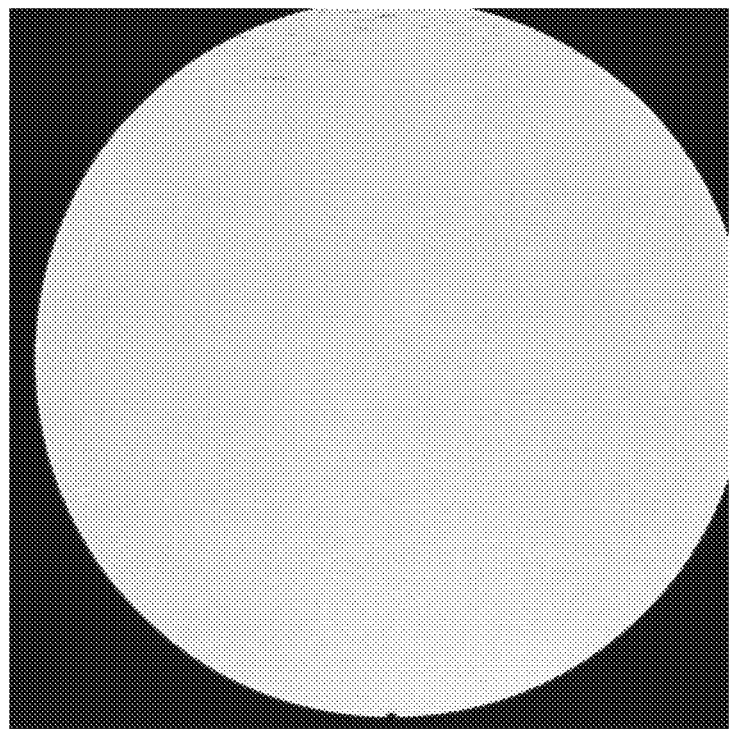
FIG. 11 is a photograph of the wafer of Example 30.

A 100 μm thermoplastic dry bonding film made in Example 25 was cut into a 200 mm wafer shape using a hot knife. The base PET film was removed from the bonding film and then was placed between a device wafer and a carrier wafer. The wafers were then bonded using a vacuum laminator under following conditions: lamination temperature of 200° C., lamination force of 2000 N, and lamination time of 3 minutes. FIG. 11 shows a CSAM image of the bonded wafer stack and showed a void-free bond.

Example 31

Comparison of Spin-Coated and Laminated Substrates

Figure 12:
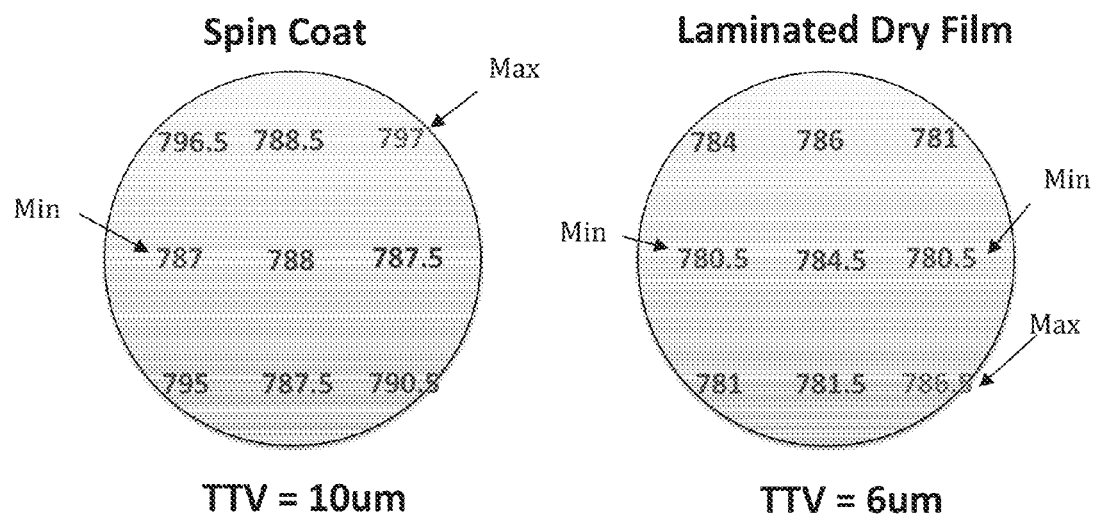
FIG. 12 depicts the thickness and total thickness variation for the spin-coated and laminated wafers of Example 31.

A 50 μm thermoplastic dry bonding film made in Example 25 was laminated onto a 200 mm silicon wafer. A second 200-mm silicon wafer was also spin-coated with Brewer-BOND® 305 material to create a 50 μm coat. The total thickness variation (TTV) of both wafers was then measured using a drop gauge to measure the film thickness across the substrate surfaces. FIG. 12 shows the measurement of the thickness and total thickness variation for the spin-coated and laminated wafers. The laminated wafer showed lower TTV than the spin-coated wafer.

Example 32

Wet Lamination of Bonding Material at 80° C.

Figure 13:
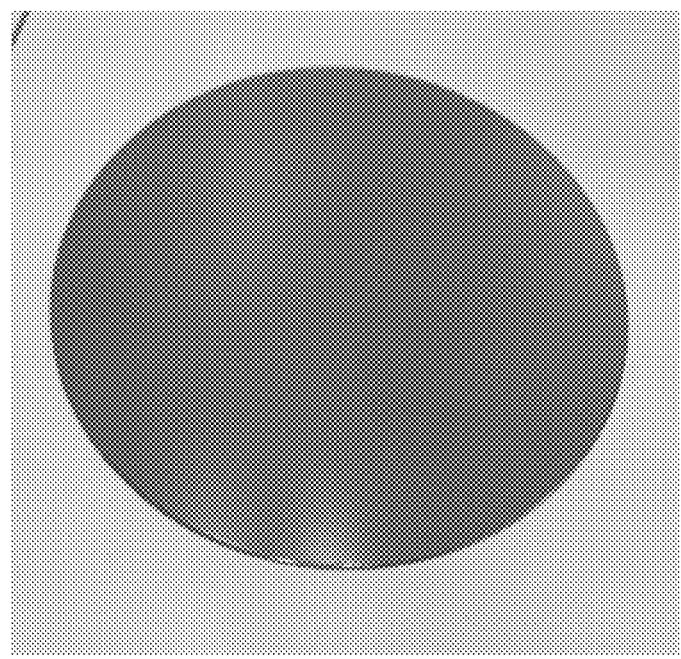
FIG. 13 is a photograph of the wafer of Example 32 after wet lamination at 80° C.

A 50 μm thermoplastic dry bonding film made in Example 25 was then laminated onto a 200 mm silicon wafer using a Tai-Ing, TI-L730 hot roll laminator after pre-wetting the silicon wafer with d-limonene solvent using the following conditions: roller temp of 80° C., speed of 0.25 meters per minute, and pressure of 1 kg/cm². The base polyethylene terephthalate (PET) film was removed from the laminated wafer after lamination. After lamination, the silicon wafer was baked for 5 minutes at 200° C. to remove the pre-wetting liquid. No voids or delamination were detected after removal of the base PET film. FIG. 13 shows an image of the bonding film laminated onto the silicon wafer.

We claim:

1. A temporary bonding method comprising:
   (i) providing a free-standing film comprising a cyclic olefin polymer;
   (ii) forming a stack at a temperature of at least 100° C., said stack comprising:
      a first substrate having a back surface and a front surface;
      a bonding layer adjacent said front surface, said bonding layer being formed from said free-standing film; and
      a second substrate having a first surface; and
   (iii) separating said first and second substrates.

2. The method of claim 1, said free-standing film being essentially free of cyclic olefin copolymers.

3. The method of claim 1, said first surface including a release layer formed thereon.

4. The method of claim 3, wherein said stack is exposed to a temperature of less than about 100° C. prior to and during said separating.

5. The method of claim 3, wherein said stack is exposed to a temperature of less than about 100° C. for about 60 seconds prior to said separating.

6. The method of claim 3, further comprising subjecting said stack to processing prior to said separating, wherein said stack is exposed to a temperature of less than about 100° C. after said processing is complete.

7. The method of claim 6, wherein said processing is selected from the group consisting of back-grinding, chemical-mechanical polishing, etching, metallizing, dielectric deposition, patterning, passivation, annealing, and combinations thereof, prior to separating said first and second substrates.

8. The method of claim 3, wherein said release layer is a nonstick layer.

9. The method of claim 8, said nonstick layer being formed from a composition comprising a polysiloxane dissolved or dispersed in a solvent system.

10. The method of claim 9, wherein said polysiloxane is selected from the group consisting of epoxyl, ethoxyl, acrylic, hydroxyl, vinyl, and amine siloxanes, and mixtures of the foregoing.

11. The method of claim 3, wherein said release layer is a laser release layer.

12. The method of claim 1, wherein said stack exhibits no defects after treatment at about 300° C. for about 30 minutes.

13. A temporary bonding method comprising:
   (i) providing a bonding film comprising a cyclic olefin polymer;
   (ii) forming a stack at a temperature of at least 100° C., said stack comprising:
      a first substrate having a back surface and a front surface;
      a bonding layer adjacent said front surface, said bonding layer being formed from said bonding film; and
      a second substrate having a first surface; and
   (iii) separating said first and second substrates.

14. The method of claim 13, wherein said bonding film comprises a single layer film.

15. The method of claim 13, wherein said bonding film comprises a continuous free-standing film, a sheet of free-standing film, a continuous film coating on a base film, or a sheet of film coating on a base film.

16. The method of claim 13, wherein said providing comprises forming said bonding film via solvent-cast slot die coating, extrusion slot die coating, screen printing, knife-over-roll coating, gravure printing, flexographic printing, inkjet printing, curtain coating, blown film, spray coating, doctor blade coating, wire wound rod coating, or metering bar coating.

17. The method of claim 13, wherein said bonding film has a thickness of about 5 μm to about 100 μm.

18. The method of claim 13, wherein said forming comprises applying said bonding film onto said first substrate and/or said second substrate via hot roll lamination or compression bonding.

19. The method of claim 18, further comprising applying a pre-wet liquid on said first substrate and/or said second substrate.

20. The method of claim 13, wherein said separating occurs without subjecting said stack to heat.

21. The method of claim 13, wherein said stack exhibits no defects after treatment at about 300° C. for about 30 minutes.

22. The method of claim 13, wherein prior to said forming, said bonding film exhibits an adhesive strength at 25° C. of less than 1 B as measured according to ASTM D3359.

23. A temporary bonding method comprising:
   (i) providing a bonding film;
   (ii) applying a wetting liquid onto (a) a first substrate having a back surface and a front surface and/or (b) a second substrate having a first surface;
   (iii) forming a stack at a temperature of at least 100° C., said stack comprising:
      said first substrate;
      a bonding layer adjacent said front surface, said bonding layer being formed from said bonding film; and
      said second substrate; and
   (iv) separating said first and second substrates.

24. The method of claim 23, wherein said wetting liquid comprises d-limonene and/or dodecene.

25. The method of claim 23, wherein said wetting liquid comprises cyclopentanone and/or cyclohexanone.

26. The method of claim 23, wherein said bonding film comprises a cyclic olefin polymer.

27. The method of claim 23, wherein said bonding film comprises a single layer film.

28. The method of claim 23, wherein said providing comprises forming said bonding film via solvent-cast slot die coating, extrusion slot die coating, screen printing, knife-over-roll coating, gravure printing, flexographic printing, inkjet printing, curtain coating, blown film, spray coating, doctor blade coating, wire wound rod coating, or metering bar coating.

29. The method of claim 23, wherein said forming comprises applying said bonding film onto said first substrate and/or said second substrate via hot roll lamination or compression bonding.

30. The method of claim 23, wherein said separating occurs without subjecting said stack to heat.

31. The method of claim 23, wherein said stack exhibits no defects after treatment at about 300° C. for about 30 minutes.

32. The method of claim 23, wherein prior to said forming, said bonding film exhibits an adhesive strength at 25° C. of less than 1 B as measured according to ASTM D3359.

* * * * *